United States Patent [19]

Kobayashi et al.

[11] Patent Number: 5,307,157
[45] Date of Patent: * Apr. 26, 1994

[54] DIGITAL VIDEO SIGNAL PROCESSING APPARATUS FOR DATA RATE DOWN-CONVERSION WITH HALF-B AND FILTERING AND MODULAR DESIGN

[75] Inventors: Nobuyoshi Kobayashi, Tokyo; Hisanori Kominami, Kanagawa, both of Japan

[73] Assignee: Sony Corporation, Tokyo, Japan

[ * ] Notice: The portion of the term of this patent subsequent to Mar. 16, 2000 has been disclaimed.

[21] Appl. No.: 21,521

[22] Filed: Feb. 23, 1993

Related U.S. Application Data

[63] Continuation of Ser. No. 796,378, Nov. 22, 1991, abandoned.

[30] Foreign Application Priority Data

Nov. 30, 1990 [JP] Japan .................... 2-338349

[51] Int. Cl.$^5$ ............................................. H04N 9/64
[52] U.S. Cl. .............................. 348/708; 364/724.16; 348/607
[58] Field of Search ............... 358/21 R, 36, 37, 166, 358/167, 160, 142, 12; 370/123, 72, 69.1; 375/103; 364/724.16, 724.01; H04N 5/213, 5/208, 5/14, 9/64

[56] References Cited

U.S. PATENT DOCUMENTS

| | | | |
|---|---|---|---|
| 4,538,178 | 8/1985 | Bolger | 358/37 |
| 4,668,988 | 5/1987 | Sasaki | 358/166 |
| 4,835,723 | 5/1989 | Hansen | 364/724.1 |
| 4,837,624 | 6/1989 | Heitmann | 358/166 |
| 4,847,684 | 7/1989 | Eino | 358/44 |
| 4,947,408 | 8/1990 | Sadr | 375/80 |
| 5,103,416 | 4/1992 | Cavallotti | 364/724.16 |
| 5,194,939 | 3/1993 | Kobayashi et al. | 358/21 |

FOREIGN PATENT DOCUMENTS 0196825 10/1986 European Pat. Off. .
2153618 8/1985 United Kingdom .

OTHER PUBLICATIONS

Patent Abstracts of Japan, vol. 7, No. 62 (E-164)(1207) Mar. 15, 1983 & JP-A-57 208 722 (Sony) Dec. 21, 1982.
Crochiere et al. 'Multirate Digital Signal Processing' 1986, Prentice-Hall, Englewood Cliffs, US paragraph 7.7; FIG. 7.59 A.

Primary Examiner—James J. Groody
Assistant Examiner—Sherrie Hsia
Attorney, Agent, or Firm—William S. Frommer; Alvin Sinderbrand

[57] ABSTRACT

A digital video signal processing apparatus for reducing the data rate of, and interpolating digital, video signals of a component format. The apparatus comprises a half-band high pass filter having a coefficient profile equivalent to that obtained by setting a center coefficient of an odd-order half-band low pass filter to zero, or a notch filter having a coefficient profile equivalent to that obtained by eliminating a center coefficient and even-numbered coefficients of such a low pass filter, and a delay line for giving a predetermined delay time to the signal supplied thereto, whereby the data rate of multiplexed or time-divided signals can be reduced, or the signals interpolated, in a relatively simple design employing a single digital filter.

12 Claims, 12 Drawing Sheets

DIGITAL VIDEO SIGNAL PROCESSING APPARATUS FOR DATA RATE DOWN-CONVERSION WITH HALF-B AND FILTERING AND MODULAR DESIGN

This application is a continuation of application Ser. No. 07/796,378, filed Nov. 22, 1991 now abandoned.

BACKGROUND OF THE INVENTION

1. Field of the Invention

The present invention relates to a digital video signal processing apparatus adapted for use in a digital video tape recorder (VTR) operating with color video signals that are in a component format.

2. Description of the Prior Art

It is known, in a digital video tape recorder of the D-1 format (4:2:2format) (hereinafter referred to as D-1 VTR) which is designed to produce component video signals separated into a luminous signal Y and color difference or chrominance signals CB and CR, to have a system clock frequency $f_{ck}$ and signal sampling frequencies $f_{sy}$, $f_{sb}$, $f_{sr}$ as given below, and the numbers of effective samples (data quantities $N_{sy}$, $N_{sb}$, $N_{sr}$ per line of the individual signals are in a ratio of 4:2:2 as follows.

$f_{ck}$ = 13.5 MHz $f_{sy} = f_{ck}$  $\quad f_{sb} = f_{sr} = f_{ck}/2$ $N_{sy} = 720$  $\quad N_{sb} = N_{sr} = 360$ In applying such a D-1 VTR to the recently proposed wide-screen television system, it has been customary heretofore to prevent geometric distortion of a reproduced image merely by compressing or extending the time base.

However, with such compression or extension of the time base, the resolution of the reproduced image is reduced by the ratio Arn/Arw of the standard and wide-angle aspects.

For the purpose of compensating for the reduction of the resolution, it has been proposed to provide a larger number of effective samples per line, as disclosed for example in Japanese Patent Laid-open No. Sho 51 (1976)-018418. According to this proposal, video signals are sampled alternately by a pair of sampling circuits and are then recorded on a recording medium in a manner to form multiple channels, and subsequently the multichannel sample signals reproduced from the recording medium are combined with each other to produce a wide-band signal.

However, if the number of effective samples is increased, naturally the quantity of data is also increased so that proper data processing cannot be accomplished by any of the currently available digital VTRs based on the 4:2:2 format.

In an attempt to solve the problem of the data quantity, the present applicant proposed a multichannel digital video signal recording/playback apparatus as disclosed in Japanese Patent Application No. Hei 1 (1989)-339231. In this apparatus, high-resolution digital video signals of an 8:4:4 format, where the number of pixels is twice the number in the video signals of a 4:2:2 format, are distributed to two channels alternately per sample in such a manner that the order of distribution is inverted every field, and the video signals are recorded by two digital VTRs of the 4:2:2 format. Thereafter the signals reproduced by such digital VTRs are combined with each other to obtain the original high-resolution digital video signals, whereby the data quantity in each channel is rendered equal to that of the current 4:2:2 format while preventing geometric distortion of the reproduced image and reduction of the resolution.

In distributing and combining the digital video signals in the manner mentioned, it follows that, as seen from the digital VTRs, data rate reduction and interpolation are respective executed with regard to the input and output signals.

Generally, in reducing the data rate of the digital video signals by a half, the signal band is limited to be narrower than a half width by a digital low pass filter so as to prevent aliasing. The filter is of a finite impulse response (FIR) type where the coefficients are symmetrical, and has such characteristic that, if it is a half-band low pass filter capable of satisfying the first Nyquist criterion the center coefficient thereof is 0.5 (to the reference value) while alternate coefficients other than the center coefficient become zero.

The characteristic of such half-band low pass filter is expressed by Eq. (1) as follows:

$$y = x(0)/2 + \sum_{n=1}^{N} k_{2n-1}[x(2n-1) + x(1-2n)] \quad (1)$$

$$\text{where } \sum_{n=1}^{N} k_{2n-1} = \tfrac{1}{4}$$

The amplitude characteristic is such that a value −6 dB is obtained at ¼ of the input signal sampling frequency $f_s$.

In an exemplary case of 10-bit data, the coefficient distribution (coefficient profile) of the filter is symmetrical with respect to the center as shown in FIG. 12 and Table 1, and even coefficients become zero with the exception of the center coefficient $k_0$.

TABLE 1

| | | |
|---|---|---|
| $k_0$ | (Half reference value) | 512 |
| $k_1$ | $k_{-1}$ | 324 |
| $k_2$ | $k_{-2}$ | 0 |
| $k_3$ | $k_{-3}$ | −102 |
| $k_4$ | $k_{-4}$ | 0 |
| $k_5$ | $k_{-5}$ | 54 |
| $k_6$ | $k_{-6}$ | 0 |
| $k_7$ | $k_{-7}$ | −32 |
| $k_8$ | $k_{-8}$ | 0 |
| $k_9$ | $k_{-9}$ | 19 |
| $k_{10}$ | $k_{-10}$ | 0 |
| $k_{11}$ | $k_{-11}$ | −11 |
| $k_{12}$ | $k_{-12}$ | 0 |
| $k_{13}$ | $k_{-13}$ | 6 |
| $k_{14}$ | $k_{-14}$ | 0 |
| $l_{15}$ | $k_{-15}$ | −3 |
| $k_{16}$ | $k_{-16}$ | 0 |
| $k_{17}$ | $k_{-17}$ | 1 |

The above half-band low pass filter is generally so composed as shown in FIG. 13.

In the half-band low pass filter 10L of FIG. 13, a multiplicity of unitary delay lines (registers) $11_1$, $11_2$ . . . $11_{2n}$; $11_{-1}$, $11_{-2}$ . . . $11_{-2n}$, whose delay time $\tau s$ is equal to the input signal sampling frequency, are connected in series between an input terminal IN and an output terminal OF where a point P is at the center. A ROM $13_0$ storing the center coefficient $k_0$ therein is connected to a multiplier $12_0$ which is connected to the point P (center tap), and multipliers $12_1$, $12_3$ . . . $12_{2n-1}$ are connected to the outputs of odd-numbered delay lines $11_1$, $11_3$ ... $11_{2n-1}$ arranged from the point P toward the terminal OF, while the output taps of even-numbered delay lines $11_2$ ... $11_{2n-2}$ are left unconnected. Multipliers $12_{-1}$, $12_{-3}$ ... $12_{1-2n}$ are connected to the inputs of the odd-numbered delay lines $11_{-1}$, $11_{-3}$ ... $11_{1-2n}$ sequentially toward the input terminal IN in a manner to be symmetrical to the above with respect to the point P, while the input taps of the even-numbered delay lines $11_{-2}$ ... $11_{2-2n}$ are left unconnected.

ROMs $13_1$, $13_3$ ... $13_{2n-1}$, $13_{-1}$, $13_{-3}$ ... $13_{1-2n}$ storing the coefficients therein are connected respectively to the multipliers $12_1$, $12_3$ ... $12_{2n-1}$; $12_{-1}$, $12_{-3}$ ... $12_{1-2n}$, and the outputs of all the multipliers 12 are added to one another in an adder 14 and then are delivered to an output terminal OS.

In producing a pair of chrominance signals of the 4:2:2 format by reducing the data rate of the aforementioned video chrominance signals CB, CR of the 8:4:4 format, there is executed, according to a simple concept, a process of limiting the band width for each of the signals CB and CR.

Therefore, two of the above half-band low pass filters are required in the conventional apparatus which tends to complicate the circuit design.

Since chrominance signals of the 8:4:4 format are premised on two-channel distribution as in the cited proposal, a pair of signals CB and CR are multiplexed in two channels as shown in FIGS. 5A and 5B which will be described later, so that the band limiting process is executed after such signals are demultiplexed, further complicating the circuit design.

Moreover, in producing a pair of chrominance signals of the 8:4:4 format by interpolating chrominance signals CB, CR of the 4:2:2 format, two digital filters are required as in the case of data rate reduction, leading to further complication of the circuit design.

In addition, to accomplish the two-channel distribution as disclosed in the cited proposal, multiplexing is required before distribution, leading to further complications in the design.

OBJECT AND SUMMARY OF THE INVENTION

It is an object of the present invention to provide an improved digital video signal processing apparatus which is capable of performing proper data rate reduction and interpolation of multiplexed signals in a relatively simple design.

According to one aspect of the present invention, there is provided a digital video signal processing apparatus for reducing the data rate of an input signal which is composed of a pair of multiplexed signals each including first and second video chrominance signal components. The apparatus comprises a half-band high pass filter having a coefficient profile equivalent to that obtained by setting a center coefficient of a half-band low pass filter to zero, and supplied with one of the pair of multiplexed signals; a delay means supplied with the other of the pair of multiplexed signals, and giving to the supplied signal a predetermined delay time corresponding to the half-band high pass filter; and an addition means for adding the output of the half-band high pass filter to the output of the delay means; wherein a multiplexed signal which includes the first and second video chrominance signal components and has a lower data rate than the input signal is outputted from the addition means.

According to, another aspect of the invention; there is provided a digital video signal processing apparatus for reducing the data rate of an input signal which is composed of a pair of time-divided signals derived from a video luminance signal. The apparatus comprises a digital notch filter having a coefficient profile equivalent to that obtained by eliminating delay lines corresponding to a center coefficient and even-numbered coefficients of a half-band low pass filter, and supplied with one of the pair of time-divided signals; a delay means supplied with the other of the pair of time-divided signals, and giving to the supplied signal a predetermined delay time corresponding to the digital notch filter; and an addition means for adding the output of the digital notch filter to the output of the delay means; wherein a video luminance signal having a lower data rate than the input signals is outputted from the addition means.

According to a further aspect of the invention, there is provided a digital video signal processing apparatus for producing, from a multiplexed signal which includes first and second video chrominance signal components, a pair of component signals each of which consists of a respective one of the first and second video chrominance signal components. The apparatus comprises a half-band high pass filter having a coefficient profile equivalent to that obtained by setting a center coefficient of a half-band low pass filter to zero, and supplied with the multiplexed signal; a delay means supplied with the multiplexed signal and giving thereto a predetermined delay time corresponding to the half-band high pass filter; and a selection means for alternately transmitting the output of the half-band high pass filter and the output of the delay means; wherein the pair of component signals are obtained from the selection means.

Thus, the data rate reduction or interpolation of the multiplexed or time-divided signals can be accomplished in a relatively simple design employing a single digital filter.

The above and other features and advantages of the present invention will become apparent from the following description which will be given with reference to the illustrative accompanying drawings.

DESCRIPTION OF THE PREFERRED EMBODIMENTS

There will now be described with reference to FIGS. 1 through 5, a first embodiment in which the present invention is applied to reduction of the data rate of chrominance signals CB, CR in the 8:4:4 format.

Figure 1:
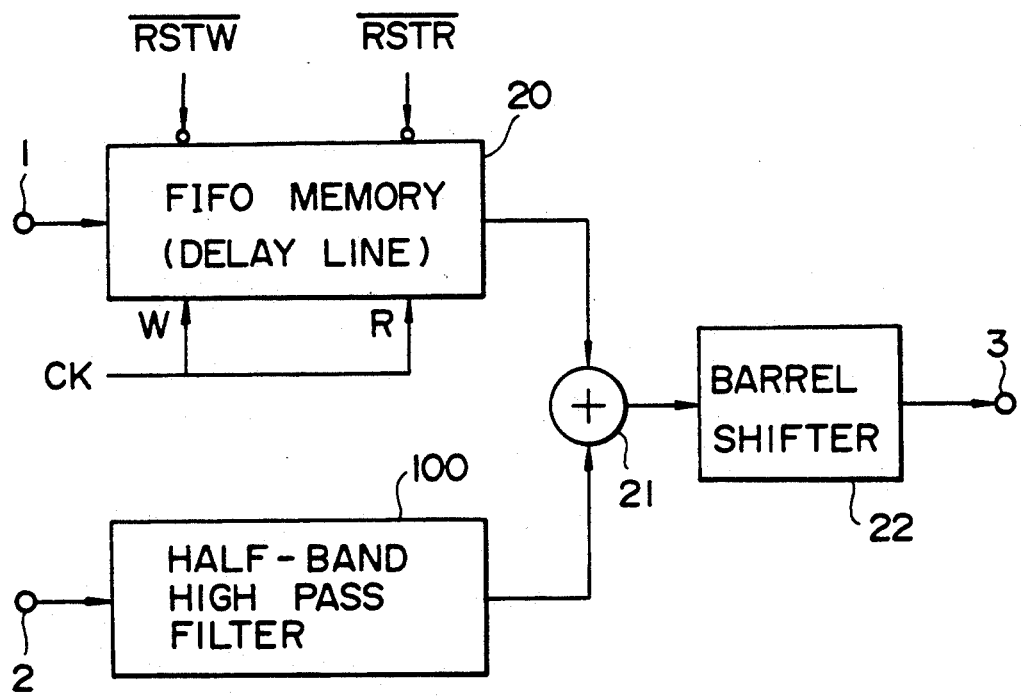
FIG. 1 is a block diagram of a first embodiment of a digital video signal processing apparatus according to the present invention.
Figure 2:
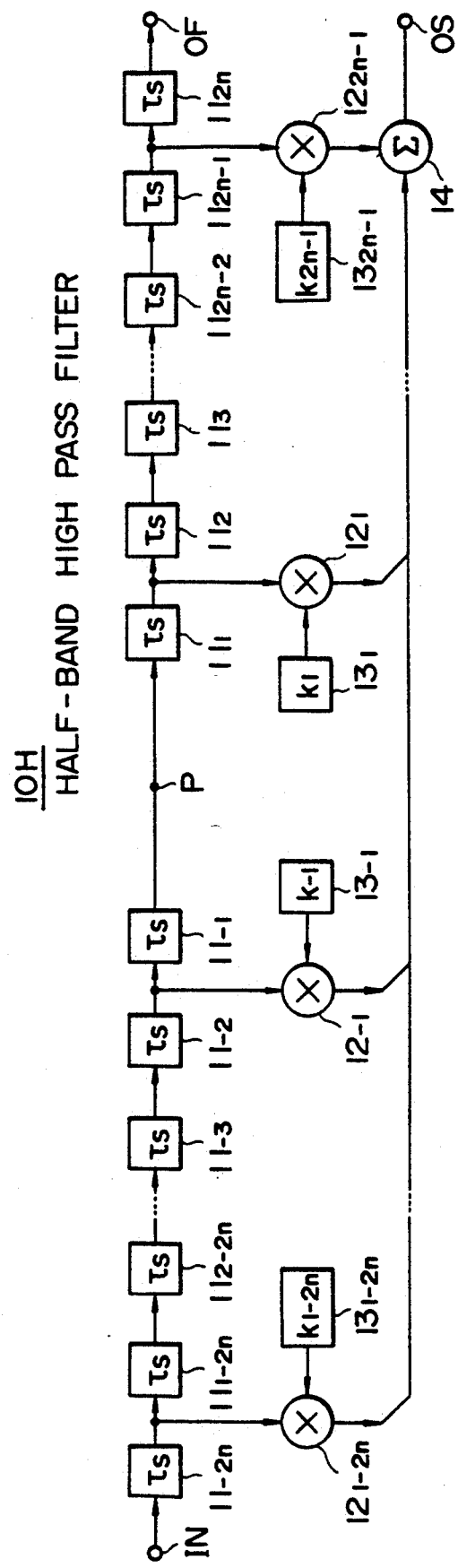
FIG. 2 is a generalized block diagram constitution of a half-band high pass filter that is part of the apparatus of FIG. 1.
Figure 3:
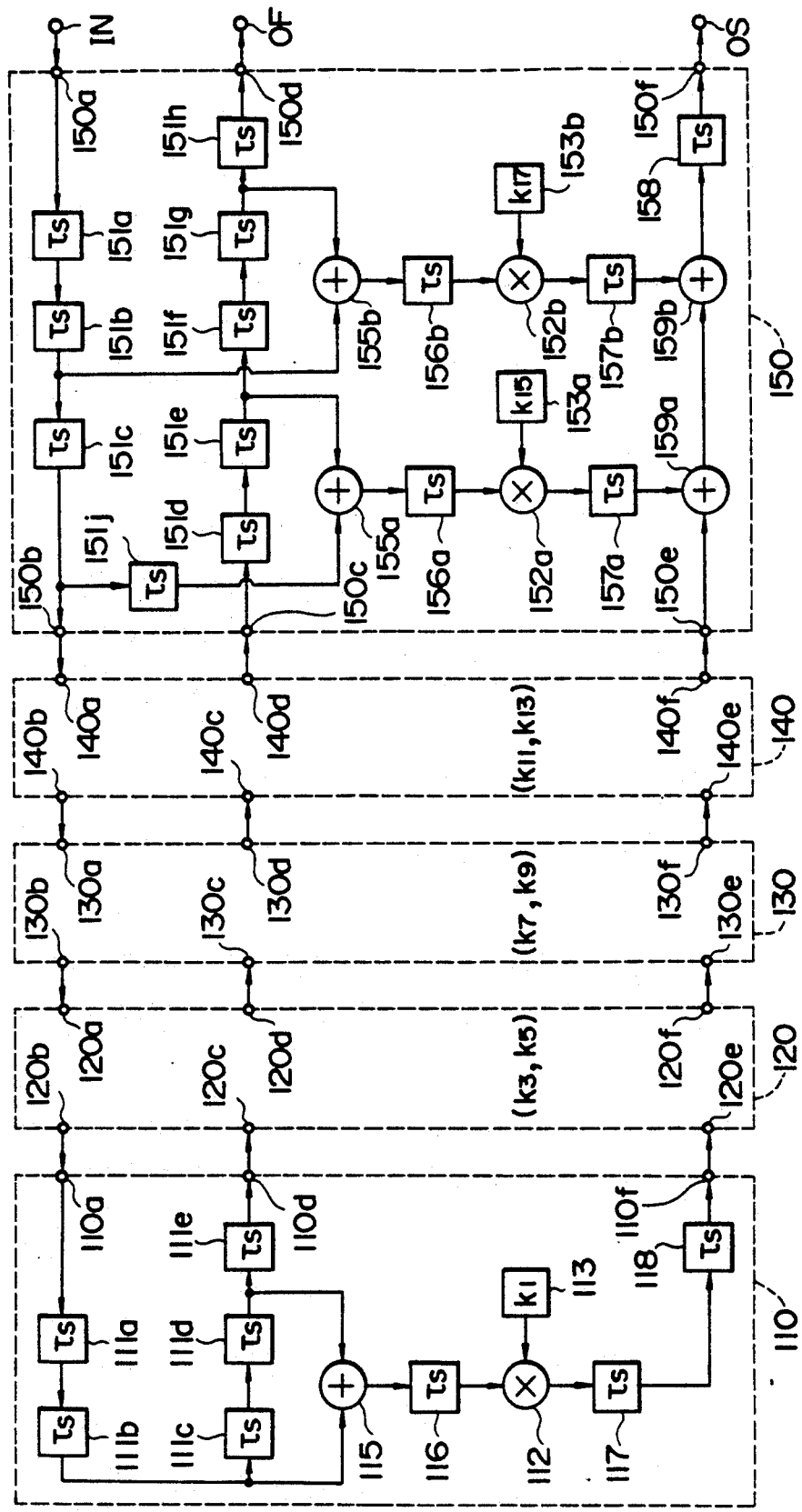
FIG. 3 is a more detailed block diagram of the half-band high pass filter of FIG. 2.

FIG. 1 is a high-level block diagram of the first embodiment, and FIGS. 2 and 3 respectively are a generalized and a more detailed block diagram of a half-band high pass filter that is part of the apparatus of FIG. 1.

The apparatus of FIG. 1 includes an FIFO memory 20 and a half-band high pass filter 100. Multiplexed chrominance signals CB, CR of the 8:4:4 format shown in FIGS. 5A and 5B are supplied from a pair of input terminals 1 and 2 respectively. The FIFO memory 20 is supplied with a write/read clock signal and a reset signal and functions as a delay line having a predetermined delay time. The outputs of the FIFO memory 20 and the half-band high pass filter 100 are supplied to an adder 21, whose output is then delivered to an output terminal 3 via a barrel shifter 22.

Figure 13:
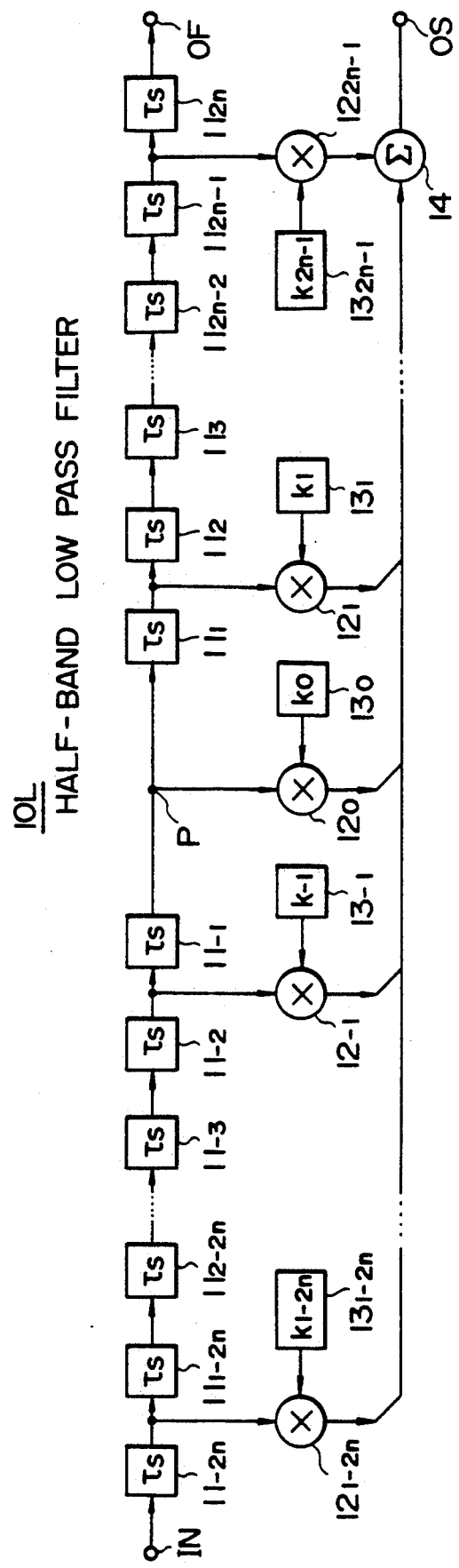
FIG. 13 is a block diagram of a typical half-band low pass filter according to the prior art.

In contrast to the aforementioned half-band low pass filter 10L shown in FIG. 13, a basic half-band high pass filter 10H is arranged so that, as shown in FIG. 2, a tap at a center point P between an input terminal IN and an output terminal OF is left unconnected. Otherwise, filter 10H is exactly the same as filter 10L of FIG. 13.

Figure 4:
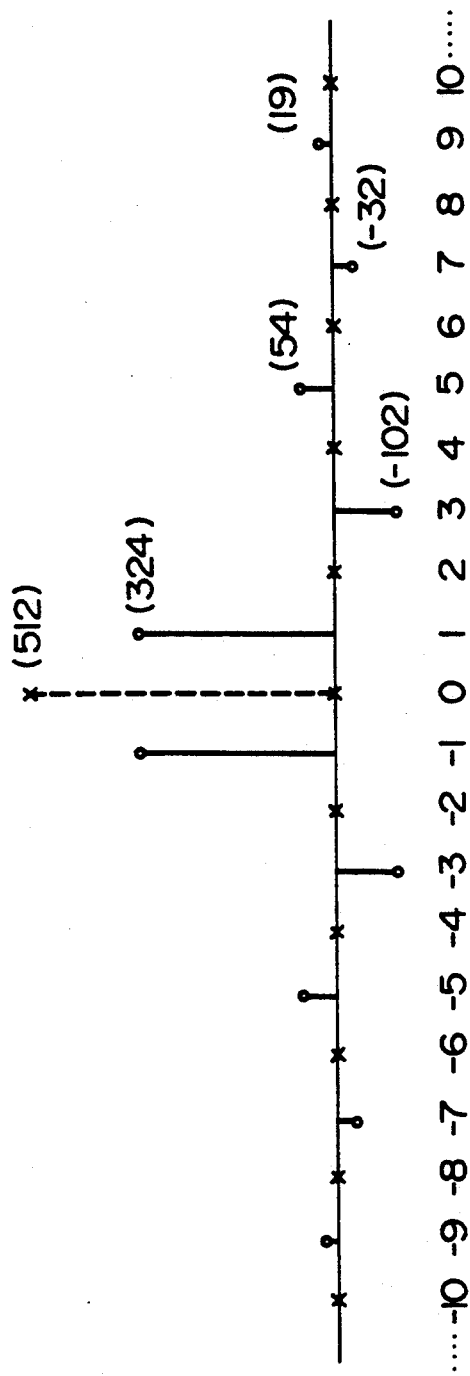
FIG. 4 graphically shows the filter characteristic of the filter of FIGS 2 and 3.

As shown in FIG. 2, half-band high pass filter 10H has a coefficient profile such that the center coefficient $k_0$ is zero and the even coefficients also are zero as shown in FIG. 4.

In the design shown in FIG. 2, the coefficient profile of the half-band high pass filter 10H is symmetrical with respect to the center point P as shown in FIG. 4, where each pair of coefficients $k_1$, $k_{-1}$; ...; $k_{17}$, $k_{-17}$ has the same value and are stored respectively in pairs of ROMs $13_1$, $13_{-1}$; ...; $13_{2n-1}$, $13_{1-2n}$ which increases the circuit scale.

Therefore, in the design shown in FIG. 3, the half-band high pass filter 10H of FIG. 2 is formed so that the coefficient profile is turned back at the center point P, and the pairs of coefficients, which are symmetrical with respect to the center are stored in individual ROMs respectively in order to reduce the circuit scale.

More specifically, in FIG. 3, the half-band high pass filter 100 comprises a unitary circuit (unit) 110 including a single coefficient ROM, and four units 120, 130, 140, 150 each including two ROMs having mutually different coefficients stored therein.

A first output terminal 150b of the unit 150 is connected to a first input terminal 140a of the unit 140, and second and third output terminals 140d, 140f of the unit 140 are connected respectively to second and third input terminals 150c, 150e of the unit 150. The units 120, 130, 140 are connected similarly in such a manner that a first output terminal 120b of the unit 120 is connected to an input terminal 110a of the unit 110, and first and second output terminals 110d, 110f of the unit 110 are connected respectively to second and third input terminals 120c, 120e of the unit 120.

In the unit 110, five unitary delay lines 111a-111e are connected in series between the input terminal 110a and the output terminal 110d. The output of the delay line 111b and the output of the delay line 111d are supplied to a multiplier 112 via an adder 115 and a delay line 116, while an input-side tap of the following delay line 111d is left connected. A coefficient ROM 113 is connected to the multiplier 112, whose output is then delivered to a second output terminal 110f via delay lines 117 and 118.

The delay lines 111e, 118 are connected respectively to the output terminals 110e, 110f are provided to that the timing of the signals coincides.

In a unit 150 which is structurally the same as the units 120, 130 and 140, three unitary delay lines 151a-151c are connected in series between a first input terminal 150a and a first output terminal 150b, and also five unitary delay lines 151d-151h are connected in series between a second input terminal 150c and a second output terminal 150d.

A first adder 155a is supplied with the output of the delay line 151c via a delay line 151j while being also supplied with the output of a delay line 151e directly. A second adder 155b is supplied with the outputs of the delay lines 151b, 151g. Input-side taps of the delay lines 151b, 151e, 151g, 151j are left unconnected.

The output of the first adder 155a is supplied via a delay line 156a to a first multiplier 152a and is multiplied by a coefficient obtained from a first ROM 153a. The output of the multiplier 152a is supplied via a delay line 157a to a third adder 159a. Similarly, the output of the second adder 155b is supplied via a delay line 156b to a second multiplier 152b and then is multiplied by a coefficient obtained from a second ROM 153b. The output of the multiplier 152b is supplied via a delay line 157b to a fourth adder 159b. The adders 159a, 159b are connected in series between a third input terminal 150e and a third output terminal 150f together with a delay line 158.

The delay lines 151h, 158 connected to the output terminals 150d, 150f are provides so that the timing of the signals coincides.

Figure 5:
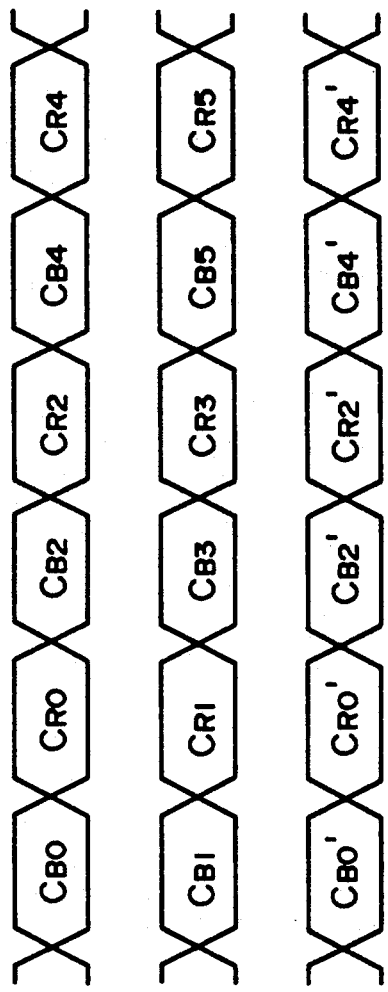
FIGS. 5A–5C schematically show signals to explain the operation of the first embodiment of the invention.

The operation of the first embodiment will now with reference to FIGS. 4 and 5.

In the half-band high pass filter 100 employed in this embodiment, the center coefficient $k_0$ is zero as shown in the coefficient profile of FIG. 4.

If the aforementioned low pass filter 10L of FIG. 13 is arranged so as to subtract the output signal of the high pass filter from the signal of a main transmission line, setting the center coefficient $k_0$ of the low pass filter to zero is equivalent to removal of the main line signal. Therefore, the half-band filter 10H of FIG. 2 and the equivalent half-band filter 100 of FIG. 3 may be regarded as high pass filters which have a reverse characteristic to that of the aforementioned low pass filter 10L shown in FIG. 13.

In this embodiment, an even sample train and an odd sample train of chrominance signals of the 8:4:4 format, where CB and CR shown in FIGS. 5A and 5B are multiplexed sample by sample, are supplied to both the FIFO memory 20 and the half-band high pass filter 100.

The two sample trains are distributed by a comb filter or the like (not shown) separately from the above, and the aliasing components thereof are mutually opposite in phase. Each of the sampling frequencies $f_{se}$ and $f_{so}$ is equal to the clock frequency $f_{ck}$ of the 4:2:2 format.

$$f_{se} = f_{so} = f_{ck} = 13.5 \text{ MHz}$$

Figure 12:
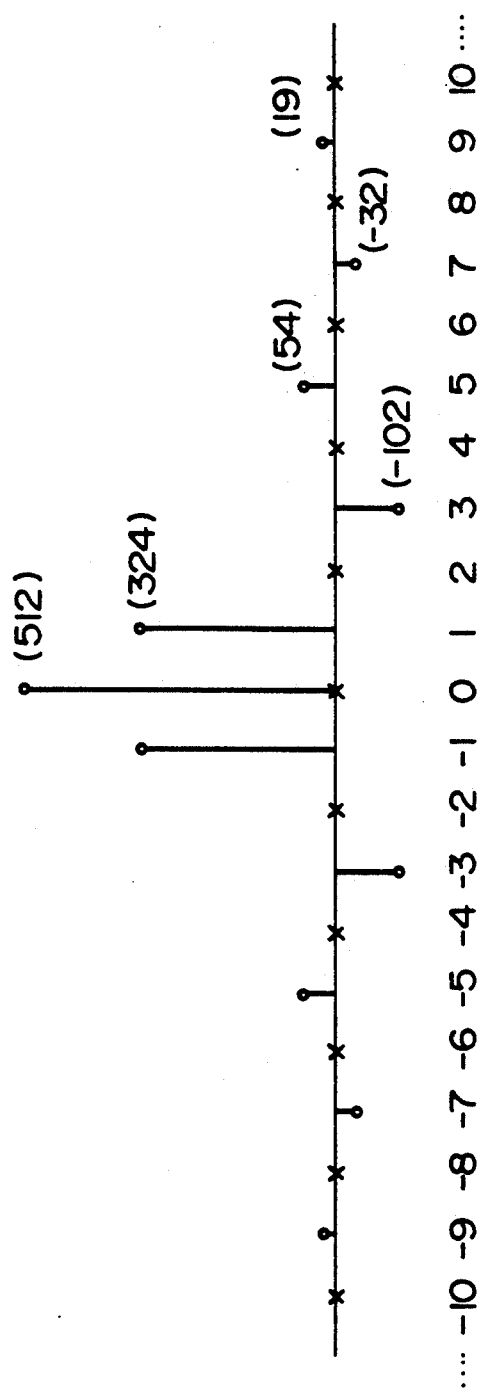
FIG. 12 graphically shows the filter characteristic of a typical half-band low pass filter according to the prior art.

The aliasing component of the odd sample train is extracted from the half-band high pass filter 100 and then is supplied to the adder 21, where such component is added to the even sample train compensated by the FIFO memory 20 with regard to the delay time of the filter 100. As mentioned already, the chrominance signal obtained from the FIFO memory 20 is a main line signal equivalent to the center coefficient $k_0$ shown in FIG. 12. When the main line signal is added to the output of the half-band high pass filter 100 where the center coefficient is zero, the aliasing components, which are mutually opposite in phase, cancel each other, so that the embodiment of FIG. 1 functions as a half-band low pass filter.

The band-limited multiplexed even sample train of CB0', CR0'; CB2', CR2'; ... shown in FIG. 5C is delivered from the output terminal 3. The sampling frequency $f_{se'}$ of such sample train is also equal to the clock frequency $f_{ck}$ of the 4:2:2 format.

$$f_{se'} = f_{ck} = 13.5 \text{ MHz}$$

Thus, in the first embodiment, which has a relatively simple design employing a single digital filter, it becomes possible to obtain multiplexed chrominance signals CB and CR of the 4:2:2 format with a data rate equal to ½ of the input data rate.

There will now be described, with reference to FIGS. 6 through 8, a second embodiment in which the present invention is applied to reduction of the data rate of a luminance signal in the 8:4:4 format.

Figure 6:
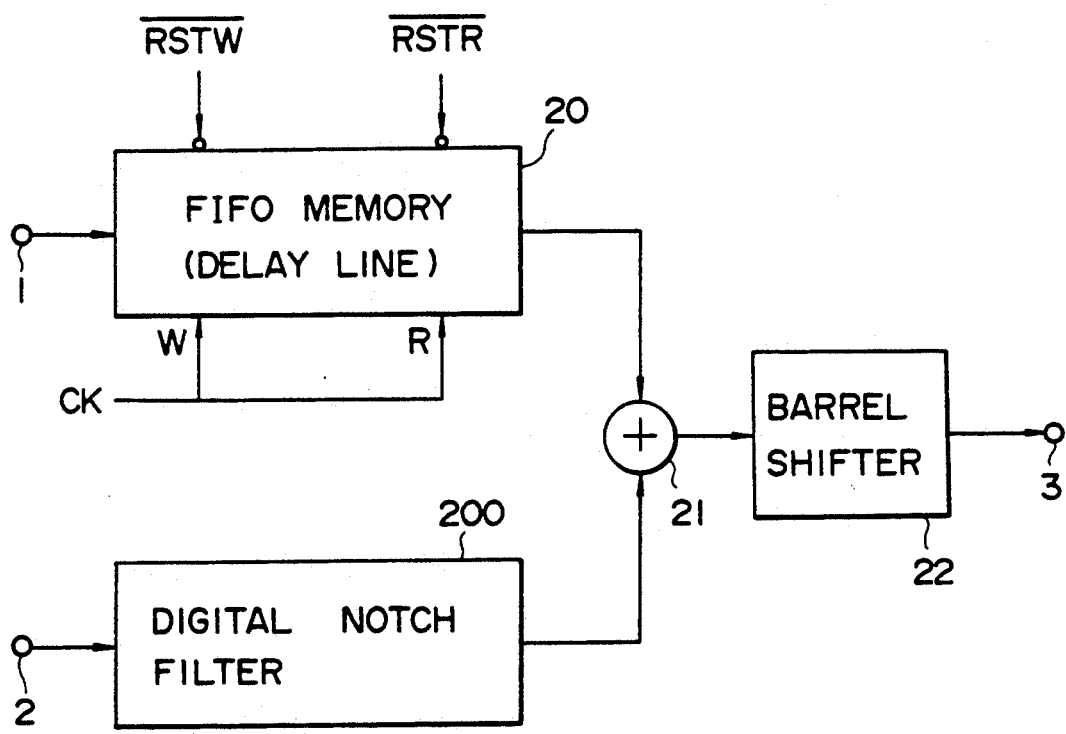
FIG. 6 is a block diagram of a second embodiment of a digital video signal processing apparatus according to the invention.
Figure 7:
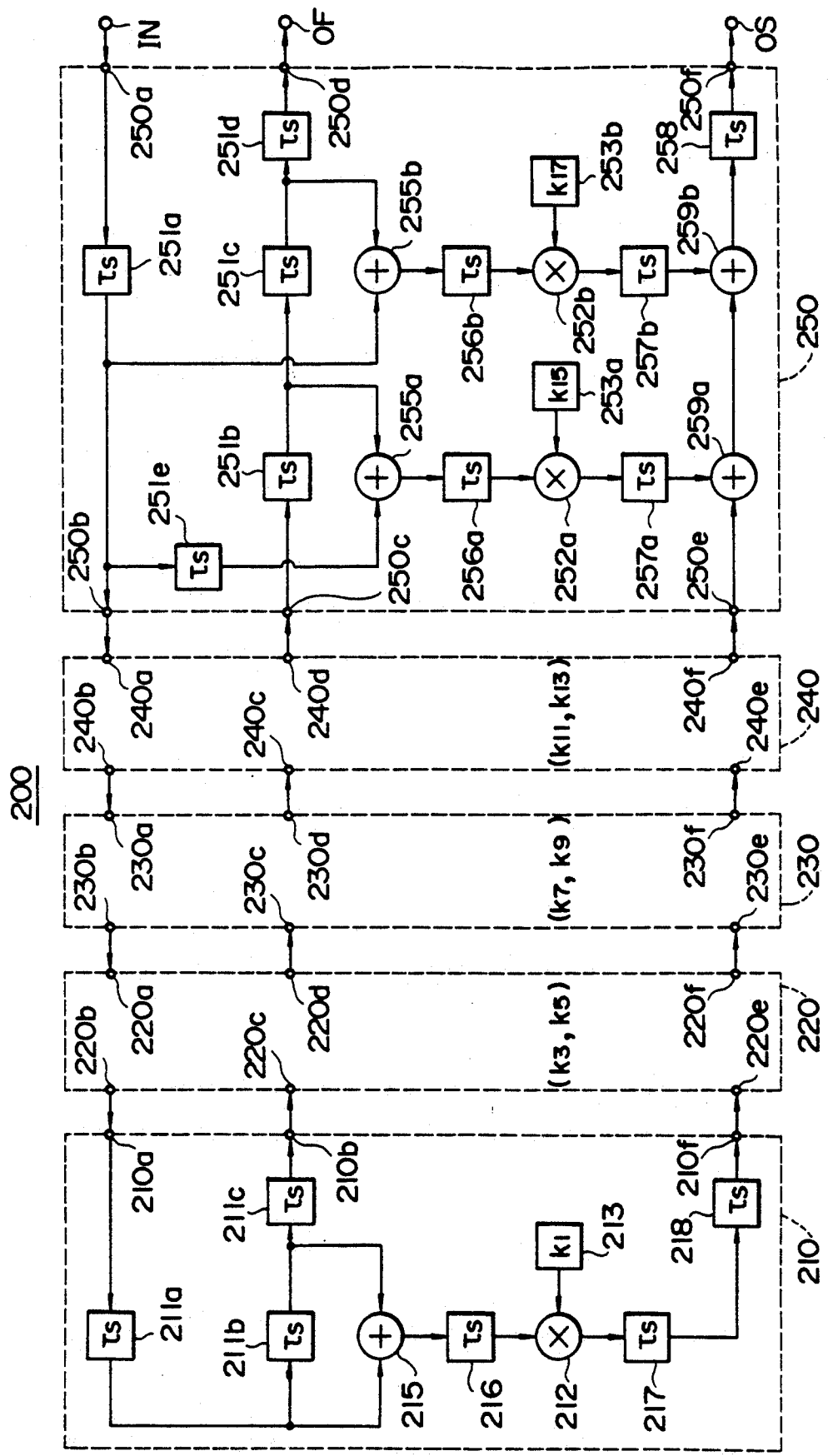
FIG. 7 is a block diagram of a digital notch filter that is a part of the apparatus of FIG. 6.

FIG. 6 is a high-level block diagram of the second embodiment, and FIG. 7 is a block diagram of a digital notch filter that is part of the apparatus of FIG. 6. In FIG. 6, components corresponding to those in FIG. 1 are denoted by the same reference numerals or symbols, and a full explanation thereof is omitted.

Figure 8A:
FIGS. 8A–8C schematically show signals to explain the operation of the second embodiment of the invention.
Figure 8B:

FIG. 6 includes an FIFO memory 20 and a digital notch filter 200, wherein luminance signals of the 8:4:4 format shown in FIGS. 8A and 8B are supplied from a pair of input terminals 1 and 2 respectively. The output of the FIFO memory 20 functioning as a delay line having a predetermined delay time and the output of the digital notch filter 200 are supplied to an adder 21, whose output is then delivered to an output terminal 3 via a barrel shifter 22.

Similarly to the aforementioned half-band high pass filter 100 of FIG. 3, the digital notch filter 200 comprises, as shown in FIG. 7, a unit 210 including one coefficient ROM and four units 220, 230, 240, 250 each including two ROMs which store mutually different coefficients. The units 210 through 250 are mutually connected in the same manner as in the high pass filter 100 of FIG. 3.

In the unit 210, these unitary delay lines 211a–211c are connected in series between an input terminal 210a and an output terminal 210b, and both the input and output of the delay line 211b are supplied to a multiplier 215. The arrangement of unit 210 after adder 215 is the same as that of the unit 110 in the aforesaid high pass filter 100 of FIG. 3. The delay lines 211c, 218 connected respectively to the output terminals 210b, 210f are provided so that the timing of the signals coincides.

In the unit 250 which is structurally the same as the units 220, 230 and 240, unitary delay line 251a is connected between a first input terminal 250a and a first output terminal 250b, and also three unitary delay lines 251b–251d are connected in series between a second input terminal 250c and a second output terminal 250d.

A first adder 255a is supplied with the output of the delay line 251a via a delay line 251e while being supplied also with the output of the delay line 251b directly. A second adder 255b is supplied with the outputs of the delay lines 251a, 251c. The arrangement of unit 250 after the two adders 255a, 255b is the same as that of the unit 150 in the high pass filter 100 of FIG. 3. The delay lines 251d, 258 connected respectively to the terminals 250d, 250f are provided so that the timing of the signals coincides.

Now the operation of the second embodiment according to the present invention will be described below with reference to FIG. 8.

The notch filter 200 is the second embodiment is formed substantially into an FIR type without any unconnected tap in rows of delay lines as shown in FIG. 7, wherein the coefficient profile thereof is such that all zero points corresponding to the center and even coefficients in the profile (shown in FIG. 4) of the high pass filter 100 in FIG. 3 are eliminated.

In other words, the second embodiment of FIG. 6 functions as a half-band low pass filter similarly to the first embodiment of FIG. 1, but the difference resides in that the coefficients of such half-band low pass filter are divided into a row of odd coefficients and a row of even coefficients, and the filter is composed principally of an FIFO memory (main line) 20 corresponding to the row of odd coefficients and a notch filter 200 corresponding to the row of even coefficients and having an amplitude characteristic skew symmetrical with respect to a frequency $f_s/4$.

The composite amplitude characteristic (absolute value) of the filter 200 is such that a zero level (notch) is at the frequency $f_s/4$, and the phase is inverted at the notch as a turnover point.

In this embodiment as shown in FIGS. 8A and 8B, an even sample train and an odd sample train of the luminance signal based on the 8:4:4 format are time-divided into two channels and are supplied respectively to the FIFO memory 20 and the notch filter 200.

Similarly to the first embodiment mentioned, the aliasing components in both sample trains are mutually opposite in phase. And each of the sampling frequencies $f_{se}$ and $f_{so}$ thereof is equal to the clock frequency $f_{ck}$ of the 4:2:2 format.

$$f_{se} = f_{so} = f_{ck} = 13.5 \text{ MHz}$$

Figure 8C:

A band-limited even sample train Y0', Y2' ... shown in FIG. 8C is delivered from the output terminal 3. The sampling frequency $f_{se'}$ of the sample train is also equal to the clock frequency $f_{ck}$ of the 4:2:2 format.

$$f_{se'} = f_{ck} = 13.5 \text{ MHz}$$

Thus, in the second embodiment, which has a relatively simple design employing a single digital filter, it becomes possible to obtain, from a luminance signal of the 8:4:4 format time-divided into two channels, a luminance signal of the 4:2:2 format with a data rate equal to ½ of the input data rate.

There will now be described, with reference to FIGS. 9 through 11, a third embodiment in which the present invention is applied to interpolation of chrominance signals CB, CR based on the 4:2:2 format.

Figure 9:
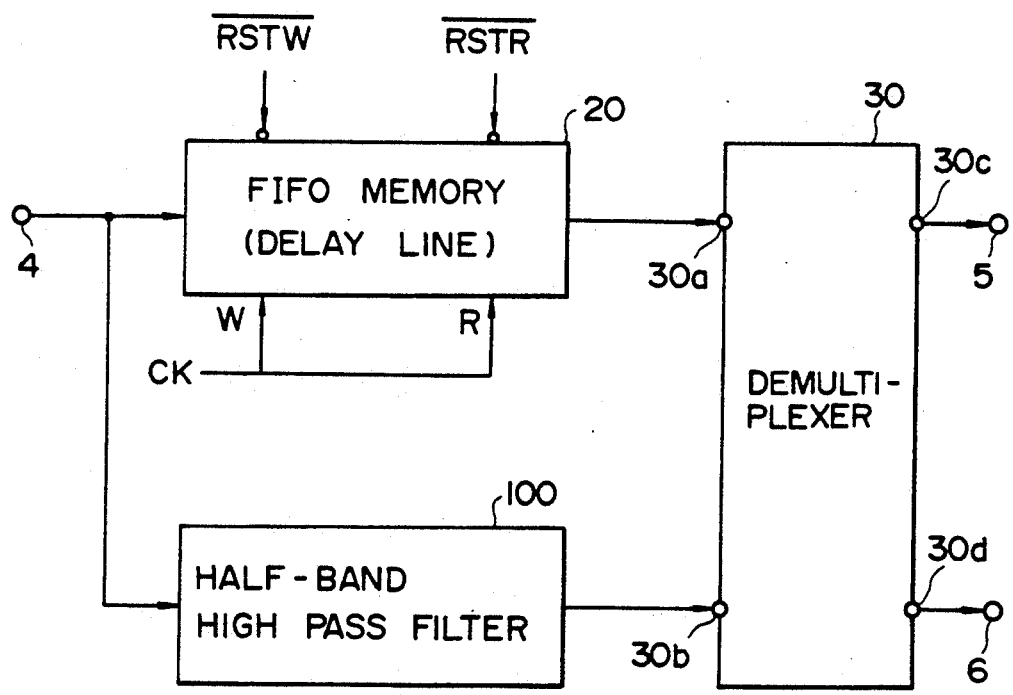
FIG. 9 is a block diagram of a third embodiment of a digital video signal processing apparatus according to the invention.
Figure 10:
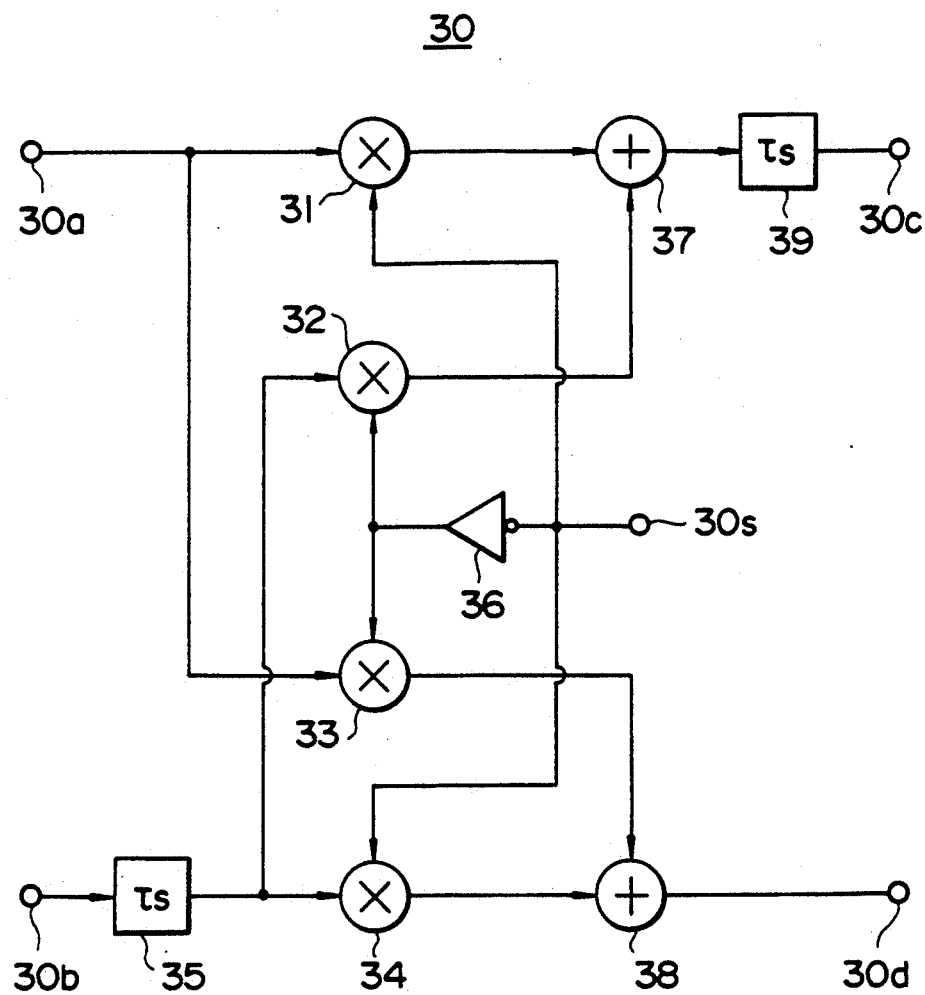
FIG. 10 is a block diagram a demultiplexer that is part of the apparatus of FIG. 9.
Figure 11:
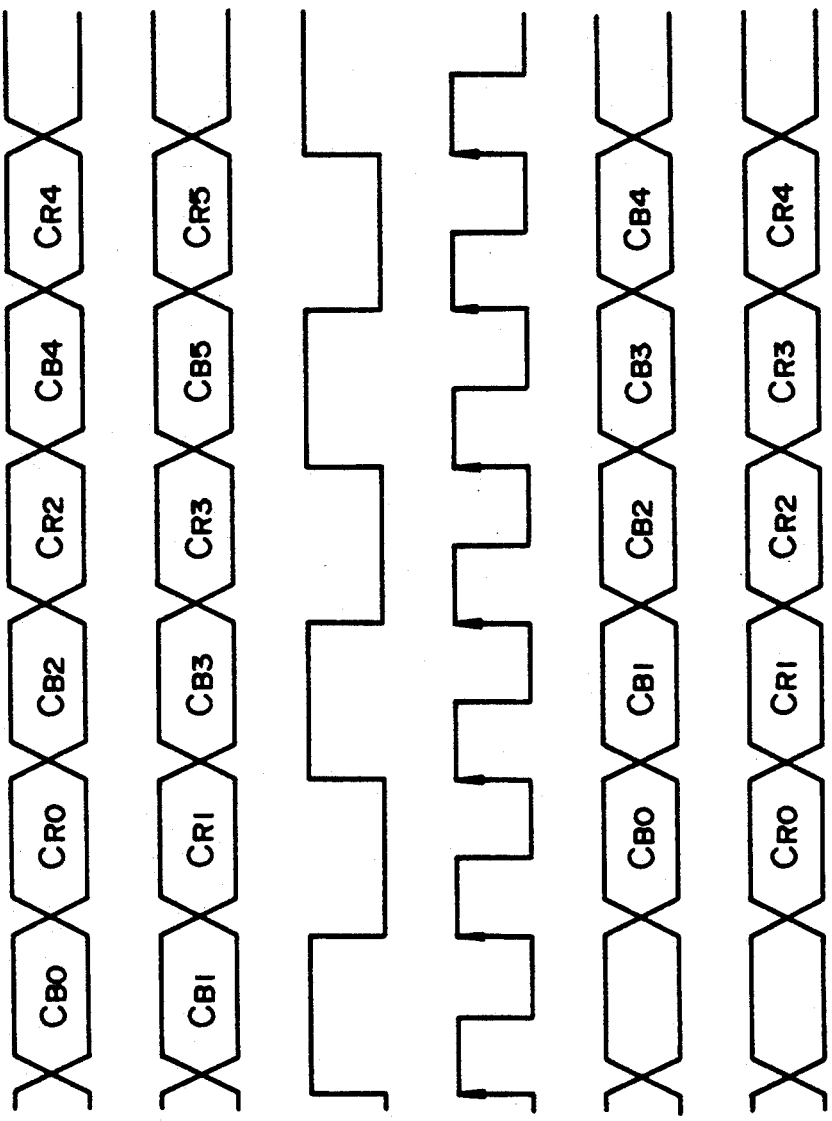
FIGS. 11A-11F schematically show signals to explain the operation of the third embodiment of the invention.

FIG. 9 is a high-level block diagram of the third embodiment, and FIG. 10 is a block diagram of a demultiplexer that is part of the apparatus of FIG. 9. In FIG. 9, components corresponding to those in FIGS. 1 and 6 are denoted by the same reference numerals or symbols, and a full explanation thereof is omitted.

In FIG. 9, multiplexed chrominance signals CB, CR of the 4:2:2 format shown in FIG. 11A are supplied from an input terminal 4 to both an FIFO memory 20 and a half-band high pass filter 100. The output of the FIFO memory 20 functioning as a delay line having a predetermined delay time and the output of the half-band high pass filter 100 are supplied respectively to input terminals 30a, 30b of a demultiplexer 30, whose output terminal 30c, 30d are connected to output terminals 5, 6 respectively.

As shown in FIG. 10, the demultiplexer 30 is equipped with four multipliers (switches) 31, 32, 33, 34, wherein one input terminal 30a is connected directly to the first and third switches 31, 33, while the other input terminal 30b is connected via a unitary delay line 35 to the second and fourth switches 32, 34.

Switching pulses shown in FIG. 11C are supplied directly from a control terminal 30s to the switches 31, 34 while being supplied also to the switches 32, 33 via an inverse amplifier 36.

The outputs of the first and second switches 31, 32 are delivered to one output terminal 30c via one adder 37 and a unitary delay line 39, while the outputs of the third and fourth switches 33, 34 are delivered to the other output terminal 30c via another adder 38.

Now the operation of the third embodiment according to the present invention will be described below with reference to FIG. 11.

In this embodiment, an even sample train of chrominance signals of the 4:2:2 format, where CB, CR are multiplexed sample by sample as shown in FIG. 11A, is supplied to the FIFO memory 20 and the half-band high pass filter 100, so that an even sample train similar to the original data is outputted from the FIFO memory 20, while interpolated data of the even sample train, i.e., the odd sample train shown in FIG. 11B, is outputted from the high pass filter 100.

Similarly to the aforementioned embodiment, each of the sampling frequencies $f_{se}$ and $f_{so}$ is equal to the clock frequency $f_{ck}$ of the 4:2:2 format.

$$f_{se}=f_{so}=f_{ck}=13.5 \text{ MHz}$$

The outputs of the FIFO memory 20 and the high pass filter 100 can be distributed respectively to two channels of the 8:4:4 format.

In the demultiplexer 30, the first and fourth switches 31, 34 and the second and third switches 32, 33 are turned on and off alternately by switching pulses of FIG. 11C. Such switching pulses are formed on the basis of a system clock signal shown in FIG. 11D.

An even sample train of the chrominance signals shown in FIG. 11A is distributed alternately to the adders 37, 38 by the first and third switches 31, 33, while an odd sample train of the chrominance signals shown in FIG. 11B is distributed alternately to the adders 37 and 38 by the second and fourth switches after being delayed for a time of one sample by the delay line 35.

As a result, the even sample train and the odd sample train in FIGS. 11A and 11B are supplied alternately to the adders 37 and 38, so that the CB samples of FIG. 11E alone are oversampled at a double rate and are outputted sequentially from the adder 37, while the CR samples of FIG. 11F alone are oversampled at a double rate and are outputted sequentially from the adder 38. The timing of the outputs of both adders 37 and 38 is made to coincide by delay line 39.

In the output of the demultiplexer 30, each of the sampling frequencies $f_{sb}$, $f_{sr}$ is also equal to the clock frequency $f_{ck}$ of the 4:2:2 format.

$$f_{sb}=f_{sr}=f_{ck}=13.5 \text{ MHz}$$

Thus, in the third embodiment, the original data and the interpolated data are combined with each other and are processed as chrominance signals of the 8:4:4 format, whereby the multiplexed chrominance signals can be interpolated and oversampled in a relatively simple design employing a single digital filter.

In connection with the above embodiments, a description has been given with regard to the processes of reducing the data rate of, and interpolating, luminance and chrominance signals of the 8:4:4 format. However, it is to be understood that the present invention is applicable to video signals of a 4:4:4 format or a 4×4 format as well.

According to the present invention, as described hereinabove, the digital video signal processing apparatus for reducing the data rate of, and interpolating, digital video signals of a component format comprises a half-band high pass filter having a coefficient profile equivalent to that obtained by setting the center coefficient of a half-band low pass filter to zero, or a notch filter having a coefficient profile equivalent to that obtained by eliminating the center and even coefficients of a half-band low pass filter, and a delay line having a predetermined delay time, hence achieving an improvement which is capable of performing data rate reduction and interpolation of multiplexed signals by a relatively simple circuit design with a single digital filter.

What is claimed is:

1. A digital video signal processing apparatus receiving an input signal which has a predetermined data rate and is composed of a pair of multiplexed signals each of which includes a first video signal component and a second video signal component, said apparatus comprising:

a half-band high pass filter having a coefficient profile equivalent to that obtained by setting a center coefficient of a half-band low pass filter to zero, and which is connected to an input terminal for receiving one of said pair of multiplexed signals, said half-band high pass filter consisting of a single unitary circuit including one coefficient ROM, and a plurality of circuits each including two coefficient ROMs in which mutually different coefficients are stored;

delay means supplied with the other of said pair of multiplexed signals, for delaying said other signal by a predetermined delay time corresponding to a delay provided by said half-band high pass filter; and addition means for adding the output of said half-band high pass filter to the output of said delay means and outputting a multiplexed signal which includes said first and second video signal components and which has a data rate that is lower than said data rate of said input signal.

2. The apparatus according to claim 1, further comprising barrel shift means for receiving said multiplexed signal output from said addition means.

3. The apparatus according to claim 1, wherein said delay means consists of an FIFO memory.

4. The apparatus according to claim 1, wherein said first and second video signal components are chrominance signal components.

5. A digital video signal processing apparatus receiving an input signal which has a predetermined data rate and is composed of a pair of time-divided signals derived from a video signal component, said apparatus comprising:

a digital notch filter having a coefficient profile equivalent to that obtained by eliminating delay lines corresponding to a center coefficient and even-numbered coefficients of a half-band low pass filter and by setting the center coefficient to zero, and which is connected to an input terminal for receiving one of said pair of time-divided signals;

delay means supplied with the other of said pair of time-divided signals, for delaying said other signal by a predetermined delay time corresponding to a delay provided by said digital notch filter; and addition means for adding the output of said digital notch filter to the output of said delay means and outputting a signal derived from said video signal component and which has a data rate that is lower than said data rate of said input signal.

6. The apparatus according to claim 5, further comprising barrel shift means for receiving said signal which is output from said addition means.

7. The apparatus according to claim 5, wherein said digital notch filter consists of a single unitary circuit including one coefficient ROM, and a plurality of unitary circuits each including two coefficient ROMs in which mutually different coefficients are stored.

8. The apparatus according to claim 5, wherein said delay means consists of an FIFO memory.

9. The apparatus according to claim 5, wherein said video signal component is a luminance signal.

10. A digital video signal processing apparatus for producing, from a multiplexed signal which includes a first video signal component and a second video signal component, a pair of component signals each of which consists of a respective one of said first and second video signal components, comprising:

a half-band high pass filter having a coefficient profile equivalent to that obtained by setting a center coefficient of a half-band low pass filter to zero, and which is connected to an input terminal for receiving said multiplexed signal, said half-band high pass filter consisting of a single unitary circuit including one coefficient ROM, and a plurality of unitary circuits each including two coefficient ROMs in which mutually different coefficients are stored;

delay means supplied with said multiplexed signal for delaying the same by a predetermined delay time corresponding to a delay provided by said half-band high pass filter; and selection means for alternately transmitting the output of said half-band high pass filter and the output of said delay means to produce said pair of component signals.

11. The apparatus according to claim 10, wherein said delay means consists of an FIFO memory.

12. The apparatus according to claim 10, wherein said first and second video signal components are chrominance signal components.

* * * * *

UNITED STATES PATENT AND TRADEMARK OFFICE
CERTIFICATE OF CORRECTION

PATENT NO. : 5,307,157
DATED : Apr. 26, 1994
INVENTOR(S) : Nobuyoshi Kobayashi, et al.

It is certified that error appears in the above-identified patent and that said Letters Patent is hereby corrected as shown below:

On the title page, Item [63] please change "Continuation of Serial No. 796,378, Nov. 22, 1991, abandoned." to --

This application is a continuation of Ser. No. 796,378, filed Nov. 22, 1991, now U. S. Patent 5,194,939.--

Signed and Sealed this

Sixth Day of September, 1994

Attest:

BRUCE LEHMAN

*Attesting Officer*  *Commissioner of Patents and Trademarks*